US010877190B2

(12) United States Patent
Yang et al.

(10) Patent No.: US 10,877,190 B2
(45) Date of Patent: Dec. 29, 2020

(54) EXTREME ULTRAVIOLET RADIATION SOURCE

(71) Applicant: TAIWAN SEMICONDUCTOR MANUFACTURING CO., LTD., Hsinchu (TW)

(72) Inventors: Chi Yang, Taichung (TW); Sheng-Ta Lin, Gongguan Township (TW); Jen-Yang Chung, Penghu County (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/538,727

(22) Filed: Aug. 12, 2019

(65) Prior Publication Data

US 2020/0057181 A1 Feb. 20, 2020

Related U.S. Application Data

(60) Provisional application No. 62/719,361, filed on Aug. 17, 2018.

(51) Int. Cl.
*G02B 5/08* (2006.01)
*G21K 1/06* (2006.01)
*G03F 1/24* (2012.01)

(52) U.S. Cl.
CPC ............. *G02B 5/0891* (2013.01); *G03F 1/24* (2013.01); *G21K 1/067* (2013.01)

(58) Field of Classification Search
CPC ............. G03F 7/70916; G03F 7/70033; G03F 7/70933; G03F 7/70925; G03F 7/20; G03F 7/2002; H05G 2/008; H05G 2/005; H05G 2/001; H05G 2/00; H05H 1/00; G21K 5/00
USPC ......... 250/504 R, 492.1, 492.2, 372, 492.22, 250/493.1, 505.1
See application file for complete search history.

(56) References Cited

U.S. PATENT DOCUMENTS

| | | | |
|---|---|---|---|
| 6,654,095 B1 * | 11/2003 | Nishi | G03F 7/70716 250/492.2 |
| 7,705,334 B2 * | 4/2010 | Yabuta | G03F 7/70033 250/492.2 |
| 8,796,666 B1 | 8/2014 | Huang et al. | |
| 9,093,530 B2 | 7/2015 | Huang et al. | |

(Continued)

*Primary Examiner* — David A Vanore
(74) *Attorney, Agent, or Firm* — McDermott Will & Emery LLP

(57) ABSTRACT

An extreme ultra violet (EUV) radiation source apparatus includes a chamber and the chamber encloses an EUV collector mirror. The EUV collector mirror is configured to collect and direct EUV radiation generated in the chamber and at least three exhaust ports are configured to remove debris from the chamber. In some embodiments, the exhaust ports are symmetrically arranged in a plane perpendicular to an optical axis of the collector mirror. In some embodiments, three exhaust ports are disposed such that an angle between any two adjacent ports is 120 degrees. In some embodiments, four exhaust ports are disposed such that an angle between any two adjacent ports is 90 degrees. In some embodiments, the chamber is configured to maintain a pressure in a range from 0.1 mbar to 10 mbar.

20 Claims, 14 Drawing Sheets

(56) References Cited

U.S. PATENT DOCUMENTS

| | | | |
|---|---|---|---|
| 9,155,180 B1* | 10/2015 | Umstadter | G03F 7/70916 |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2* | 1/2018 | Huang | G03F 7/70033 |
| 9,869,939 B2 | 1/2018 | Yu et al. | |
| 2002/0014598 A1* | 2/2002 | Melnychuk | B82Y 10/00 |
| | | | 250/504 R |
| 2003/0006383 A1* | 1/2003 | Melnychuk | G03F 7/70033 |
| | | | 250/504 R |
| 2004/0046949 A1* | 3/2004 | Ohgushi | G03F 7/70033 |
| | | | 355/53 |
| 2004/0108473 A1* | 6/2004 | Melnychuk | H05H 1/06 |
| | | | 250/504 R |
| 2004/0218158 A1* | 11/2004 | Nishi | G03F 9/7034 |
| | | | 355/30 |
| 2005/0115333 A1* | 6/2005 | Fujimoto | G01F 1/00 |
| | | | 73/861 |
| 2006/0186356 A1* | 8/2006 | Imai | G03F 7/70916 |
| | | | 250/504 R |
| 2006/0243927 A1* | 11/2006 | Tran | G03F 7/70916 |
| | | | 250/504 R |
| 2007/0228298 A1* | 10/2007 | Komori | H05G 2/008 |
| | | | 250/493.1 |
| 2009/0224179 A1* | 9/2009 | Shirai | G03F 7/70841 |
| | | | 250/492.1 |
| 2009/0224181 A1* | 9/2009 | Abe | G03F 7/70916 |
| | | | 250/504 R |
| 2010/0051827 A1* | 3/2010 | Derra | G03F 7/70166 |
| | | | 250/492.1 |
| 2010/0200776 A1* | 8/2010 | Yabu | H05G 2/005 |
| | | | 250/504 R |
| 2011/0002569 A1* | 1/2011 | Derra | G03F 7/70808 |
| | | | 384/478 |
| 2013/0134318 A1* | 5/2013 | Abhari | G02B 19/0095 |
| | | | 250/372 |
| 2014/0253716 A1* | 9/2014 | Saito | H05G 2/005 |
| | | | 348/87 |
| 2016/0150625 A1* | 5/2016 | McGeoch | H05G 2/005 |
| | | | 250/504 R |
| 2016/0255707 A1* | 9/2016 | Ueda | H05G 2/008 |
| | | | 250/504 R |
| 2017/0315446 A1* | 11/2017 | Ueda | H05G 2/006 |
| 2018/0173117 A1* | 6/2018 | Chien | G03F 7/70175 |
| 2019/0116655 A1* | 4/2019 | Hori | G21K 1/06 |
| 2020/0004159 A1* | 1/2020 | Yeh | G03F 7/70483 |
| 2020/0057181 A1* | 2/2020 | Yang | G03F 1/24 |
| 2020/0103758 A1* | 4/2020 | Chen | G03F 7/2002 |

* cited by examiner

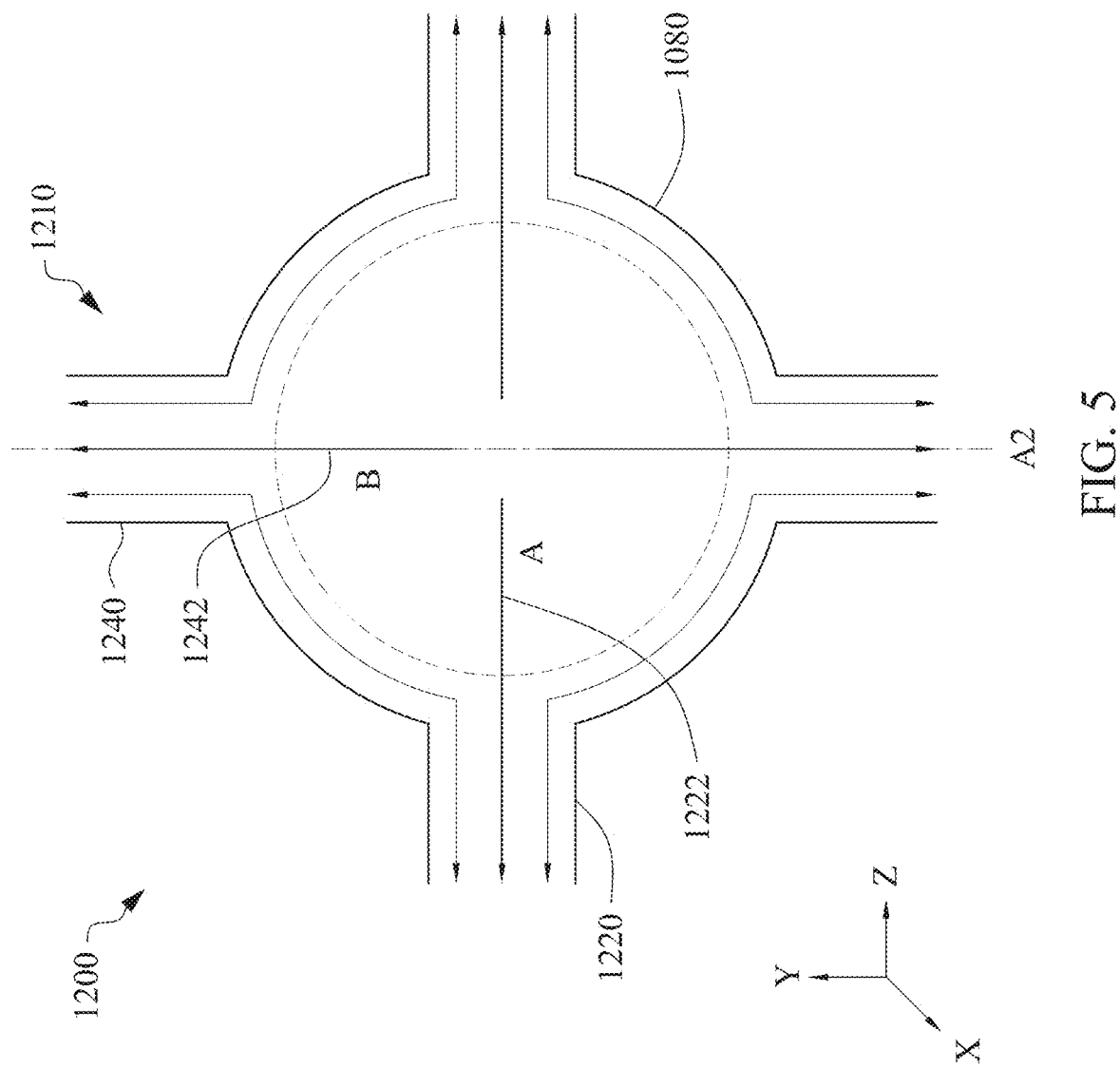

EXTREME ULTRAVIOLET RADIATION SOURCE

CROSS-REFERENCE TO RELATED APPLICATION

The present application claims priority to and incorporates by reference U.S. Provisional Application 62/719,361 filed on Aug. 17, 2018 in its entirety.

BACKGROUND

Extreme ultraviolet (EUV) lithography is being used to fabricate semiconductor devices having feature size of less than 22 nm to meet the ever-present demand of increased device density in integrated circuits.

One method of generating EUV radiation for EUV lithography is by using laser produced plasma (LPP), where droplets of molten metal such as tin are heated using a laser to generate plasma which emits the EUV radiation. Because EUV radiation is ionizing radiation, the EUV radiation source is typically kept under vacuum. In other words, the droplets of molten metal are introduced in a vacuum chamber where they are heated to produce the EUV radiation. The EUV radiation produced by the plasma is collected using a collector mirror and focused on other optics from where it is directed to a lithography tool.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5 schematically illustrates a top view of a debris exhausting structure according to an embodiment.

DETAILED DESCRIPTION

Figure 1:
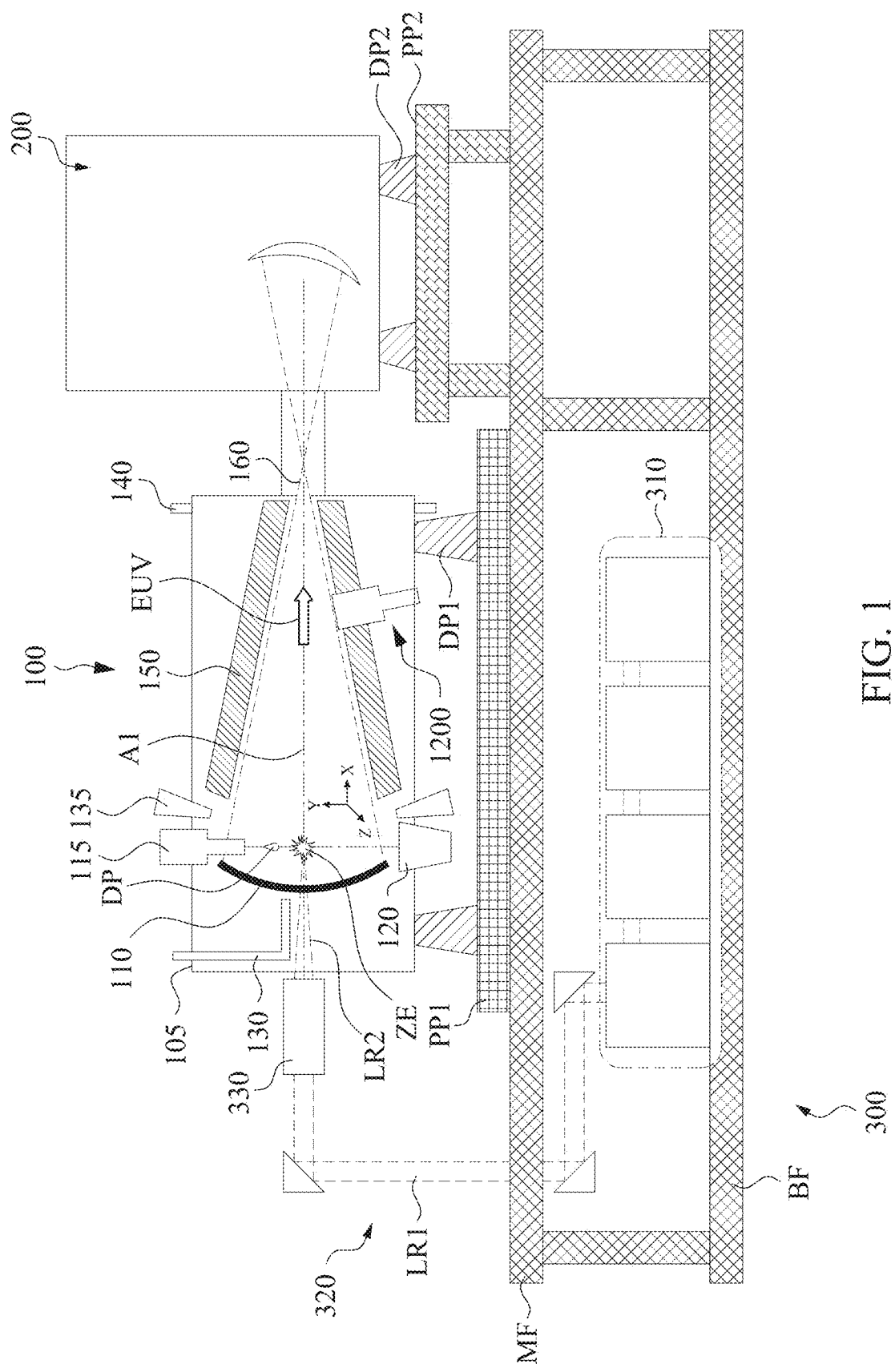
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to apparatus and methods for mitigating contamination on an EUV collector mirror in a laser produced plasma (LPP) EUV radiation source. The EUV collector mirror, also referred to as an LPP EUV collector mirror or an EUV collector mirror, is an important component of the LPP EUV radiation source. It collects and reflects EUV radiation and contributes to overall EUV conversion efficiency. However, it is subjected to damage and degradation due to the impact of particles, ions, radiation, and debris deposition. In particular, tin (Sn) debris is one of the contamination sources of the EUV collector mirror. EUV collector mirror life time, the time duration where the reflectivity decays to half of the initial reflectivity, is one of the most important factors for an EUV scanner. The major reason of reflectivity decay of the EUV collector mirror is residual metal contamination (tin debris) on the EUV collector mirror surface caused, inevitably, by the EUV light generation procedure.

One of the objectives of the present disclosure is directed to reducing debris deposition onto the LPP EUV collector mirror thereby increasing its usable lifetime. The technology of this disclosure keeps the EUV collector mirror in a desirable status for a longer period of time by reducing the frequency of swapping the EUV collector mirror. In other words, an EUV scanner will maintain the highest exposure power and throughput, and require less frequent maintenance, thereby reducing the frequency of the week-long down time required to swap EUV collector mirror.

FIG. 1 is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module 210 for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image onto the resist.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP EUV collector mirror 110, enclosed by a chamber 105. The target droplet generator 115 generates a plurality of target droplets DL. In some embodiments, the target droplets DL are tin (Sn) droplets. In some embodiments, the tin droplets each have a diameter about 30 microns (μm). In some embodiments, the tin droplets DL are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The excitation laser (laser pulses) LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The excitation laser (laser light) LR1 generated by the laser generator 300 is guided by the laser guide optics 320 and focused into the excitation laser LR2 by the focusing apparatus 330, and then introduced into the EUV radiation source 100.

The excitation laser (laser light) LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the EUV collector mirror 110. The EUV collector mirror 110 further reflects and focuses the EUV radiation for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The EUV collector mirror 110 is designed with a proper coating material and shape to function as a mirror for EUV collection, reflection, and focusing. In some embodiments, the EUV collector mirror 110 is designed to have an ellipsoidal geometry. In some embodiments, the coating material of the EUV collector mirror 100 is similar to the reflective multilayer of the EUV mask. In some examples, the coating material of the EUV collector mirror 110 includes a ML (such as a plurality of Mo/Si film pairs) and may further include a capping layer (such as Ru) coated on the ML to substantially reflect the EUV light. In some embodiments, the EUV collector mirror 110 may further include a grating structure designed to effectively scatter the laser beam directed onto the EUV collector mirror 110. For example, a silicon nitride layer is coated on the EUV collector mirror 110 and is patterned to have a grating pattern.

In such an EUV radiation source apparatus, the plasma caused by the laser application creates physical debris, such as ions, gases and atoms of the droplet, as well as the desired EUV radiation. It is necessary to prevent the accumulation of material on the EUV collector mirror 110 and also to prevent physical debris exiting the chamber 105 and entering the exposure tool 200.

As shown in FIG. 1, in some embodiments, a buffer gas is supplied from a first buffer gas supply 130 through the aperture in EUV collector mirror 110 by which the pulse laser is delivered to the tin droplets. In some embodiments, the buffer gas is $H_2$, He, Ar, N or another inert gas. In certain embodiments, $H_2$ is used as H radicals generated by ionization of the buffer gas can be used for cleaning purposes. The buffer gas can also be provided through one or more second buffer gas supplies 135 toward the EUV collector mirror 110 and/or around the edges of the EUV collector mirror 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the EUV collector mirror 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms 150 are employed in the chamber 105.

Figure 2B:
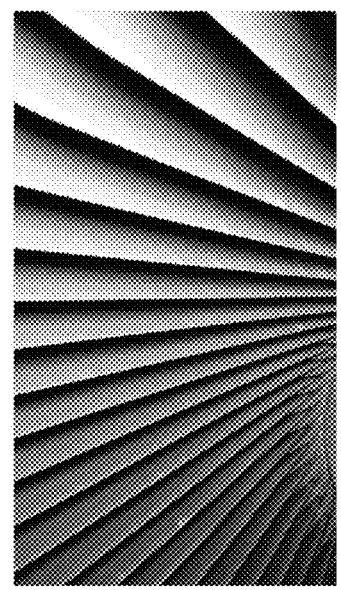
FIG. 2B is a schematic side view of a debris collection mechanism used in the EUV radiation source according to some embodiments of the present disclosure.
Figure 2C:
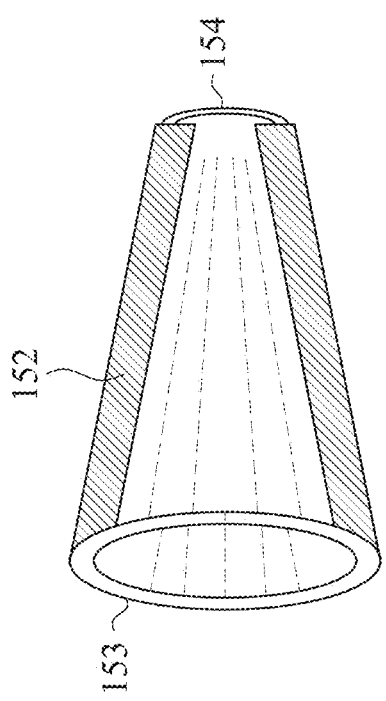
FIG. 2C is a partial picture of a vane used in the EUV radiation source according to some embodiments of the present disclosure.
Figure 2A:
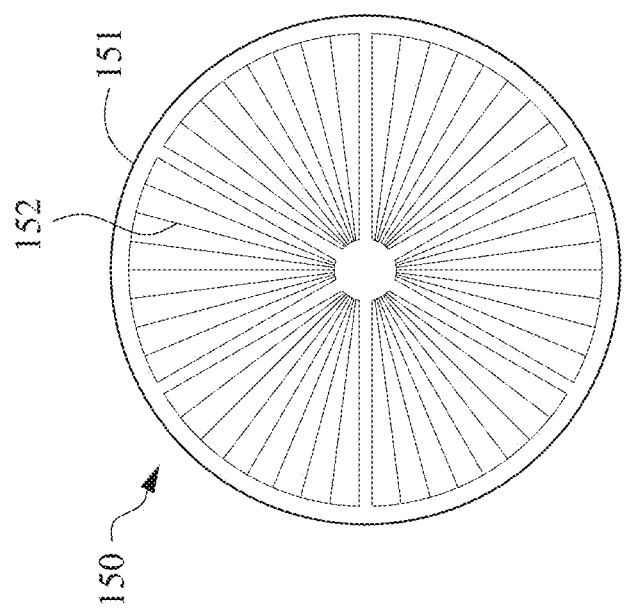
FIG. 2A is a schematic front view of a debris collection mechanism used in the EUV radiation source according to some embodiments of the present disclosure.

As shown in FIG. 1, one or more debris collection mechanisms (DCM) 150 are disposed along the optical axis A1 between the zone of excitation ZE and an output port 160 of the EUV radiation source 100. FIG. 2A is a front view of the debris collection mechanisms 150 and FIG. 2B is a schematic isometric view of the debris collection mechanisms 150. FIG. 2A is a front view of the DCM 150 and FIG. 2B is a schematic side view of DCM 150. FIG. 2C is a partial detailed view of the DCM 150. The debris collection mechanisms 150 include a frustoconical support frame 151, a first end support 153 and a second end support 154 that operably support a plurality of vanes 152 that rotate within the housings. The first end support 153 has a larger diameter than the second end support 154. The debris collection mechanisms 150 serve to prevent the surface of EUV collector mirror 110 and/or other elements/portions of the inside the chamber 105 from being coated by Sn vapor by sweeping out slow Sn atoms and/or $SnH_4$ via rotating vanes 152.

The plurality of vanes 152 project radially inwardly from the frustoconical support frame 151. The vanes 152 are thin and elongate plates. In some embodiments, each of the vanes has a triangular or trapezoid or trapezium shape in plan view. The vanes 152 are aligned so that their longitudinal axes are parallel to the optical axis A1 so that they present the smallest possible cross-sectional area to the EUV radiation EUV. The vanes 152 project towards the optical axis A1, but do not extend as far as the optical axis. In some embodiments, a central core of the debris collection mechanisms 150 is empty. The debris collection mechanisms 150 are rotated by a drive unit including one or more motors, one or more belts and/or one or more gears, or any rotating mechanism. The vanes 152 are heated at 100° C. to 400° C. by a heater in some embodiments.

Figure 3A:
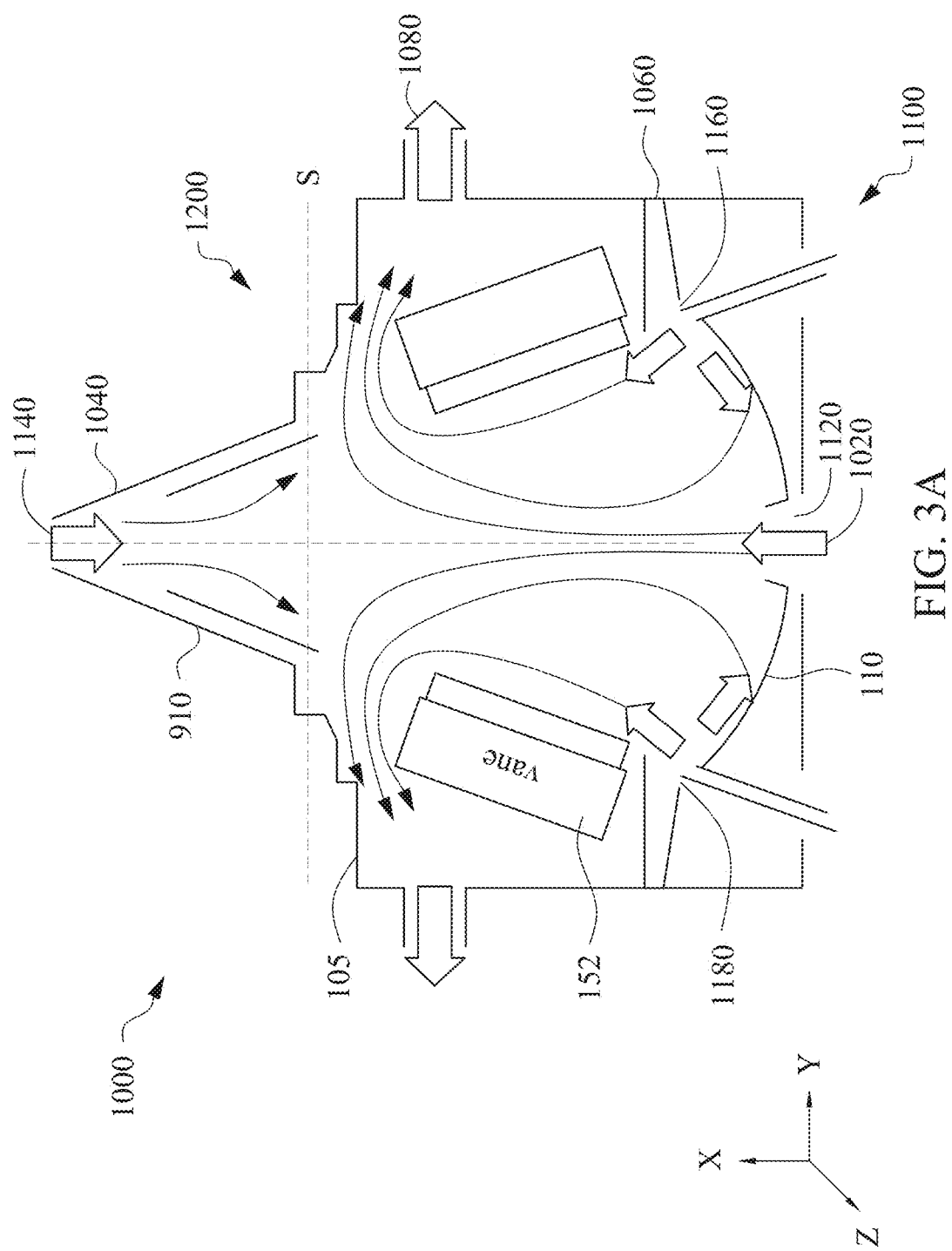
FIG. 3A schematically illustrates an exhaust flow for an EUV source according to an embodiment.
Figure 3B:
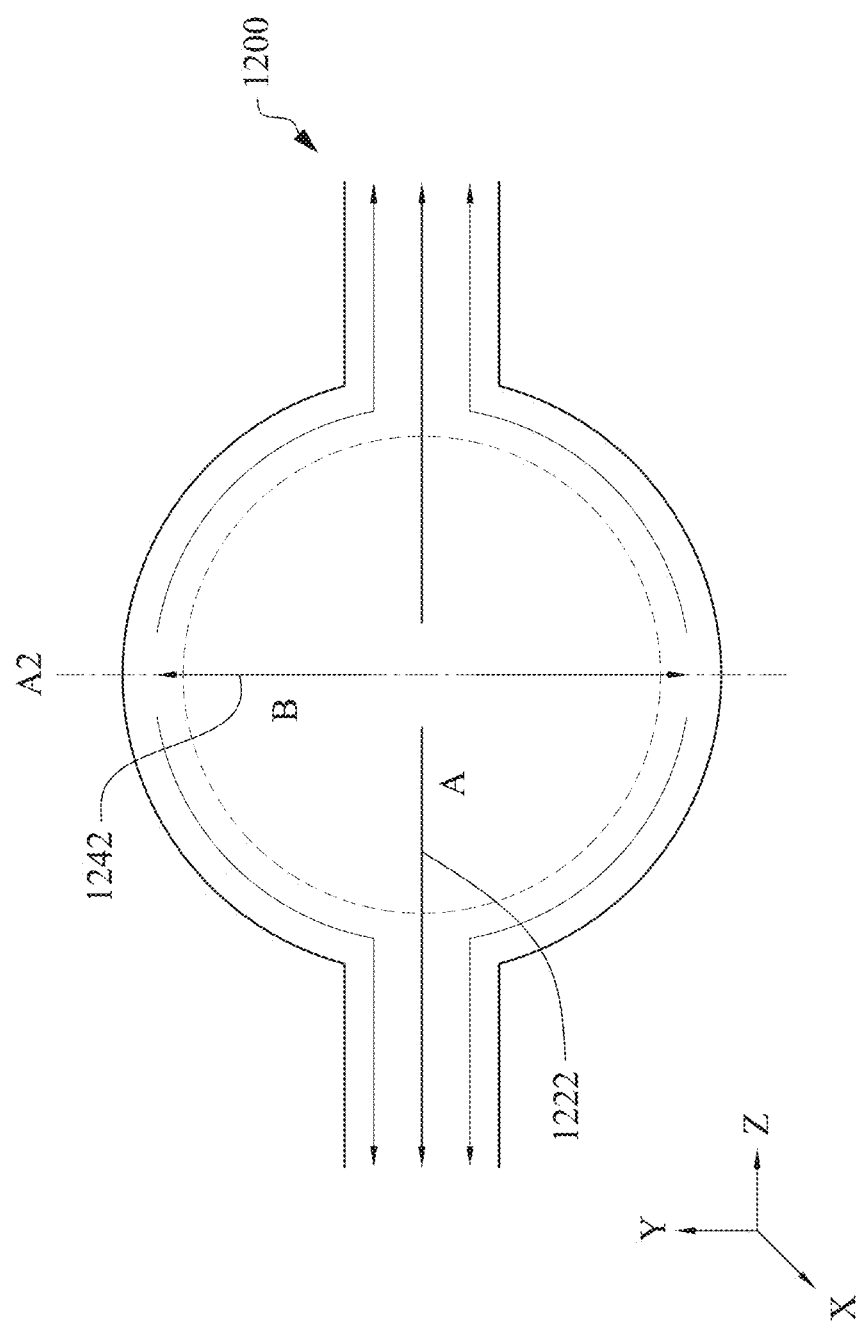
FIG. 3B schematically illustrate cross-sectional top view of an exhaust layout for an EUV source according to an embodiment.

FIGS. 3A and 3B schematically illustrate a chamber 105 for an EUV source according to an embodiment. The chamber 105 includes an EUV vessel 1000, including: a collector mirror 110, a droplet generator 115 (see FIG. 1), a tin catcher 120 (see FIG. 1), vanes 152, and a lower cone 910.

As shown in FIG. 3A, the EUV vessel 1000 further includes a plurality of inlet ports 1100 and outlet ports 1200 for receiving and transmitting cleaning gas. In some embodiments, the plurality of inlet ports 1100 includes a first cleaning gas port 1120 disposed in a first inlet portion 1020 of the EUV vessel 1000, a second cleaning gas port 1140 disposed in second inlet portion 1040, and third and fourth cleaning gas ports 1160, 1180 disposed in a third inlet portion 1060 of the EUV vessel 1000. The exhaust ports 1200 of the EUV vessel 1000 are located in outlet portions 1080 of the EUV vessel 1000. While the EUV vessel 1000 shown in FIG. 3A includes the above inlet and outlet ports, alternative embodiments of the EUV vessel 1000 may include a different number and/or arrangement of inlet and/or outlet ports.

The EUV vessel 1000 includes the plurality of inlet ports 1100 and outlet ports 1200 so that the EUV vessel 1000 may transmit and receive hydrogen to and/or from the chamber 105 within the EUV radiation source apparatus 100. Hydrogen flowing through the EUV vessel 1000 may adhere to the debris within the EUV vessel 1000. As such, the hydrogen may remove the debris within the EUV vessel 1000.

In addition, FIG. 3A also illustrates a schematic of the flow of hydrogen in the chamber. As can be seen from the top view in FIG. 3B, the exhaust ports 1200 are arranged in a dipolar exhaust layout (e.g., at a 3 O'clock and a 9 O'clock position with respect to a droplet direction A2 shown in FIG. 3B) because of spatial constraints. The exhaust ports 1200 are located symmetrically in a plane perpendicular to the axis of the collector mirror. This results in a first internal flow passage 1222 ("A") being shorter than a second internal flow passage 1242 ("B"). Thus, the first internal flow passage 1222 has a better exhaust efficiency compared to the second internal flow passage 1242.

Figures 4A, 4B:
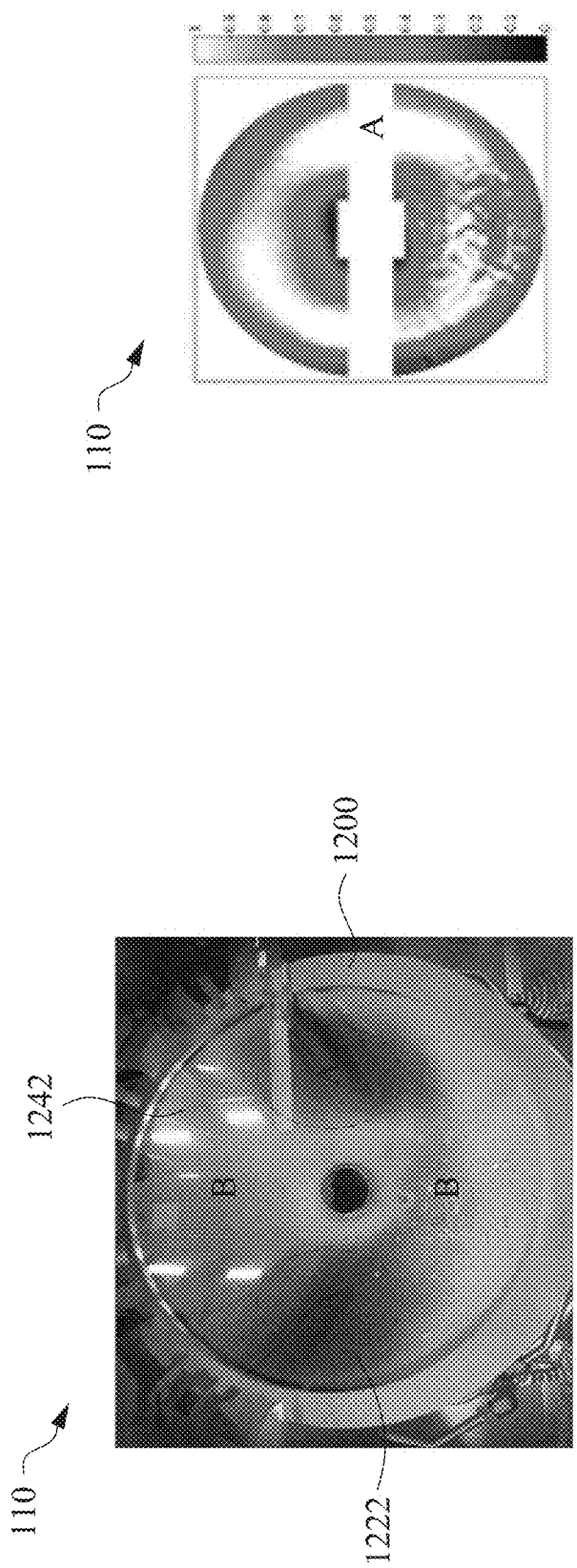
FIGS. 4A and 4B illustrate photographs of a contaminated collector mirror.

FIG. 4A shows a photograph of a contaminated collector mirror 110. FIG. 4B shows ray descramble optics analysis (RADON) patterns from collector mirror 110. As can be seen in FIG. 4A, tin contamination is observed at 12 and 6 O'clock positions in the second internal flow passage 1242 ("B"), more specifically, positions perpendicular to the exhaust ports 1200 where the exhaust ports 1200 are not present. On the other hand, the 3 and 9 O'clock positions in the first internal flow passage 1222 ("A") have less contamination and are, thus, easier to self-clean. Brighter portion ("A") of the collector mirror 110 in FIG. 4B has a better reflectivity. Without wishing to be bound by theory, the less contamination may be the result of a better exhaust efficiency in these regions. As such, additional exhaust ports in the configuration of the dipolar exhaust layout may reduce contamination of the collector mirror 110 of the EUV vessel 1000.

FIG. 5 shows a schematic view of the EUV vessel 1000 according to an embodiment of the present disclosure. In some embodiments, the exhaust ports 1200 and the outlet portions 1080 are part of a debris exhausting structure 1210 as shown in FIG. 5. The debris exhausting structure 1210 collects metal debris delivered by the hydrogen cleaning gas and guides the collected metal debris to the outside of the EUV vessel 1000. In some embodiments, as shown in FIG. 5, the debris exhausting structure 1210 includes first exhaust ports 1220 coupled with the first internal flow passage 1222 and second exhaust ports 1240 coupled with the second internal flow passage 1242 to collect the debris mixed with the hydrogen cleaning gas. In some embodiments, the second exhaust ports 1240 are arranged along the droplet axis A2 and perpendicular to the first exhaust ports 1220.

Figure 6A:
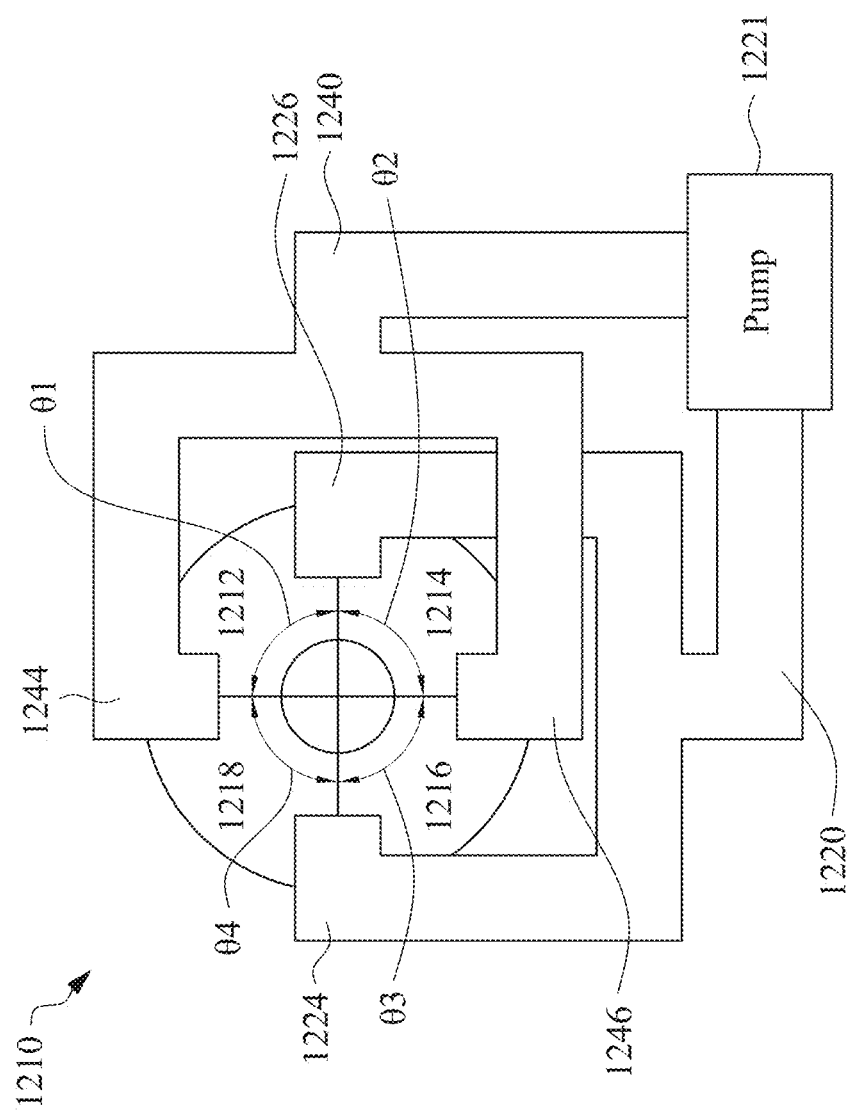
FIGS. 6A, 6B, and 6C schematically illustrate some exemplary layouts of the debris exhausting structure according to various embodiments.

In some embodiments, as shown in FIG. 6A, the debris exhausting structure 1210 includes frustoconical surface portions 1212, 1214, 1216, 1218 of the debris collection mechanisms 150. The frustoconical surface portions 1212, 1214, 1216, 1218 have a fan shape having central angles $\theta1$, $\theta2$, $\theta3$, $\theta4$. In some embodiments, the central angles $\theta1$, $\theta2$, $\theta3$, $\theta4$ may be in a range from about 85 degrees to about 95 degrees. In some embodiments, the central angles $\theta1$, $\theta2$, $\theta3$, $\theta4$ may be same. The frustoconical surface portions 1212, 1214, 1216, 1218 of the debris collection mechanisms 150 may be equally divided into four fan areas (quadrants), where at least one of the four fan areas subtends an angle $\theta=90$ degrees. In some embodiments, angles $\theta1$, $\theta2$, $\theta3$, $\theta4$ may be different.

FIG. 6A schematically illustrates a top view of the quadruple exhaust manifold according to an embodiment. In some embodiments, four pipes 1224, 1226, 1244, 1246 having a same length and same number of bends are provided so that pumping rates from all four pipes are substantially equal. In some embodiments, the exhaust manifold includes valves for each of the four pipes to control the pump flow from each of the four pipes (see FIG. 6B). In FIG. 6A, all four pipes are shown to be connected to a single pump 1221, in some embodiments the four pipes may be individually connected to four separate pumps. Such arrangement provides better control of flow rates from each of the four pipes in some embodiments.

Figure 6B:
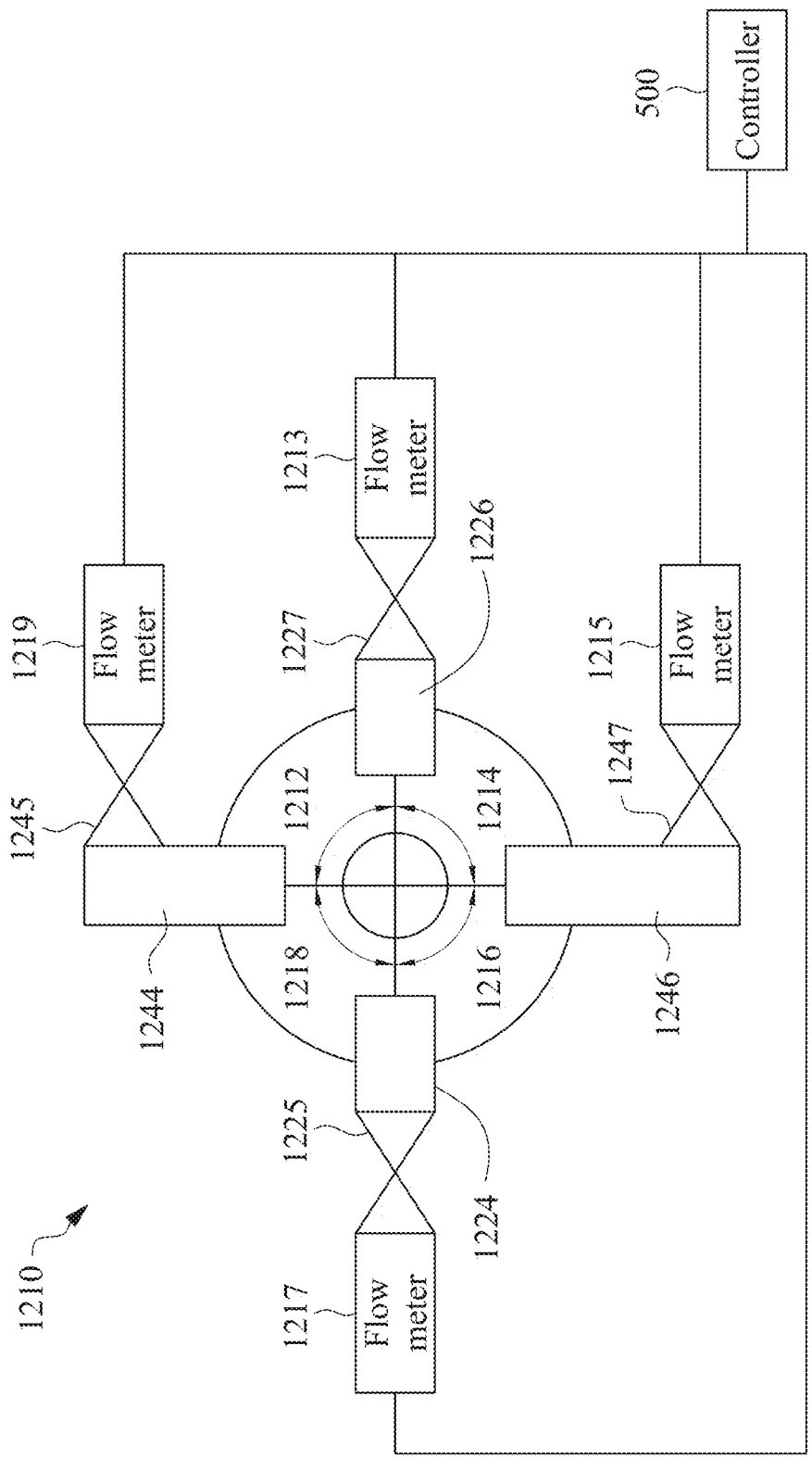

In some embodiments as shown in FIG. 6B, each of the four pipes 1224, 1226, 1244, 1246 may be connected to flow meters 1213, 1215, 1217, 1219 via valves 1225, 1227, 1245, 1247, respectively. In some embodiments, a controller 500 is operatively connected to the flow meters 1213, 1215, 1217, 1219 and the valves 1225, 1227, 1245, 1247. The controller 500 controls operations of the four separate pumps or the valves 1225, 1227, 1245, 1247 based on measured flow rates of each of the flow meters 1213, 1215, 1217, 1219, respectively. In some embodiments, the controller 500 includes a processor and a memory storing a control program and when the control program is executed by the processor, the control program causes the processor to perform intended operations. In other embodiments, the controller 500 includes a microcomputer.

In various embodiments, the pressure in the chamber is maintained to be in a range from about 0.1 millibars to about 10 millibars. For example, the pressure in the chamber is maintained between about 1-2 millibars in some embodiments. The pressure of the pump end of each of the three pipes is about 0.1 millibars lower than the pressure inside the chamber to maintain the flow of the gas (e.g., hydrogen) through the pipes.

Figure 6C:
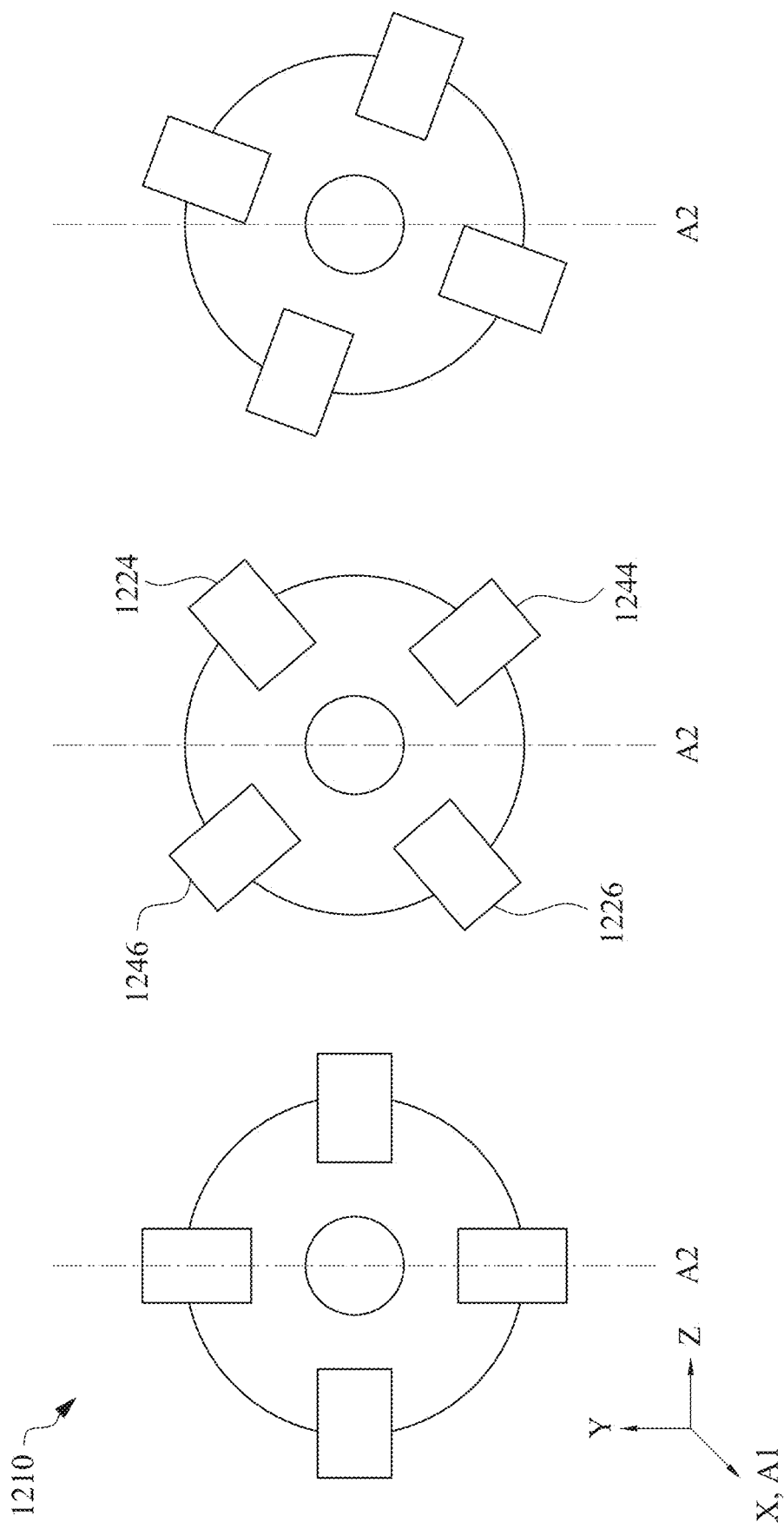

The present system may utilize any appropriate configuration of the debris exhausting structure 1210 or the four pipes 1224, 1226, 1244, 1246 relative to the droplet axis A2, including the configurations illustrated in FIG. 6C.

Figure 7:
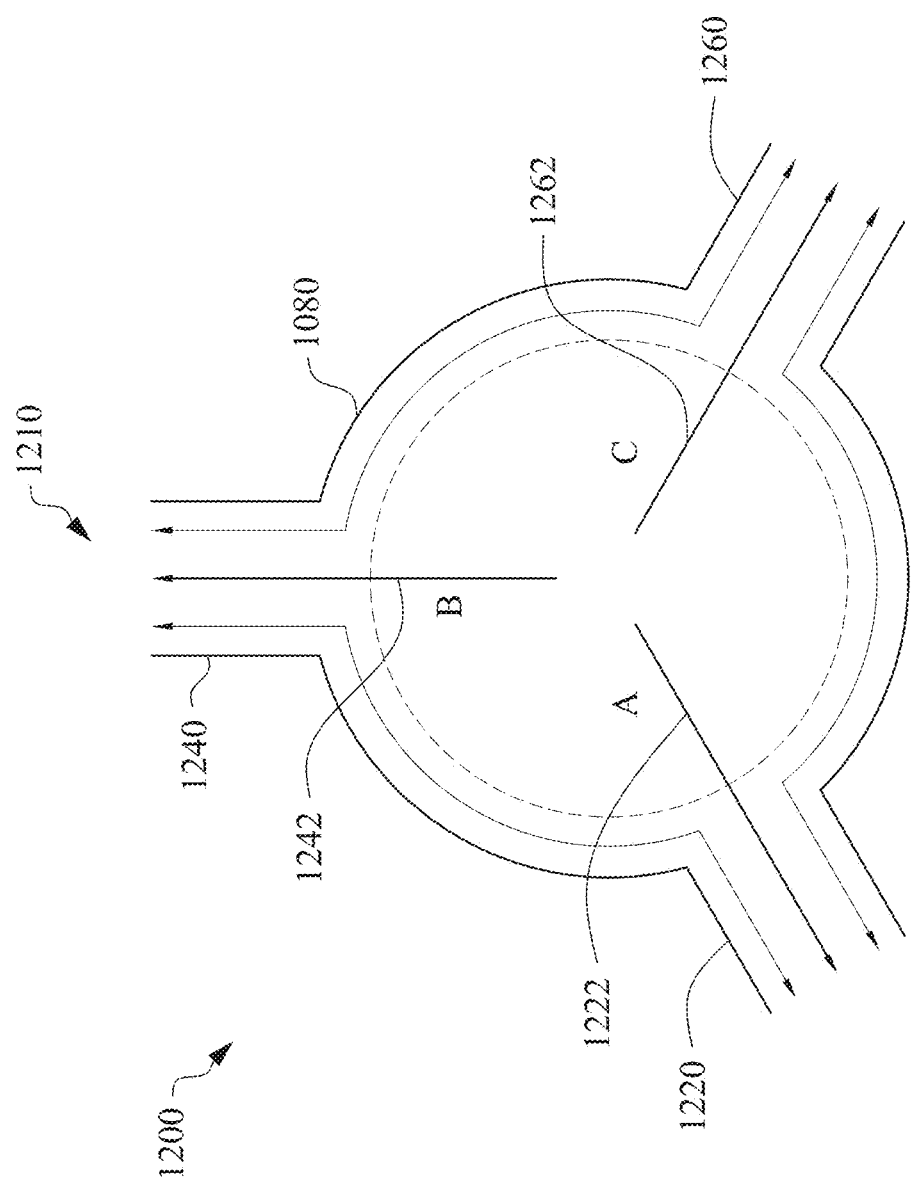
FIG. 7 schematically illustrates a top view of alternative debris exhausting structure according to an embodiment.

FIG. 7 shows a schematic view of the EUV vessel 1000 according to another embodiment of the present disclosure. In some embodiments, the debris exhausting structure 1210 includes first exhaust ports 1220 coupled with a first internal flow passage 1222, second exhaust ports 1240 coupled with a second internal flow passage 1242 and a third exhaust port 1260 coupled with a third internal flow passage 1262 to collect the debris mixed with the hydrogen cleaning gas.

Figure 8A:
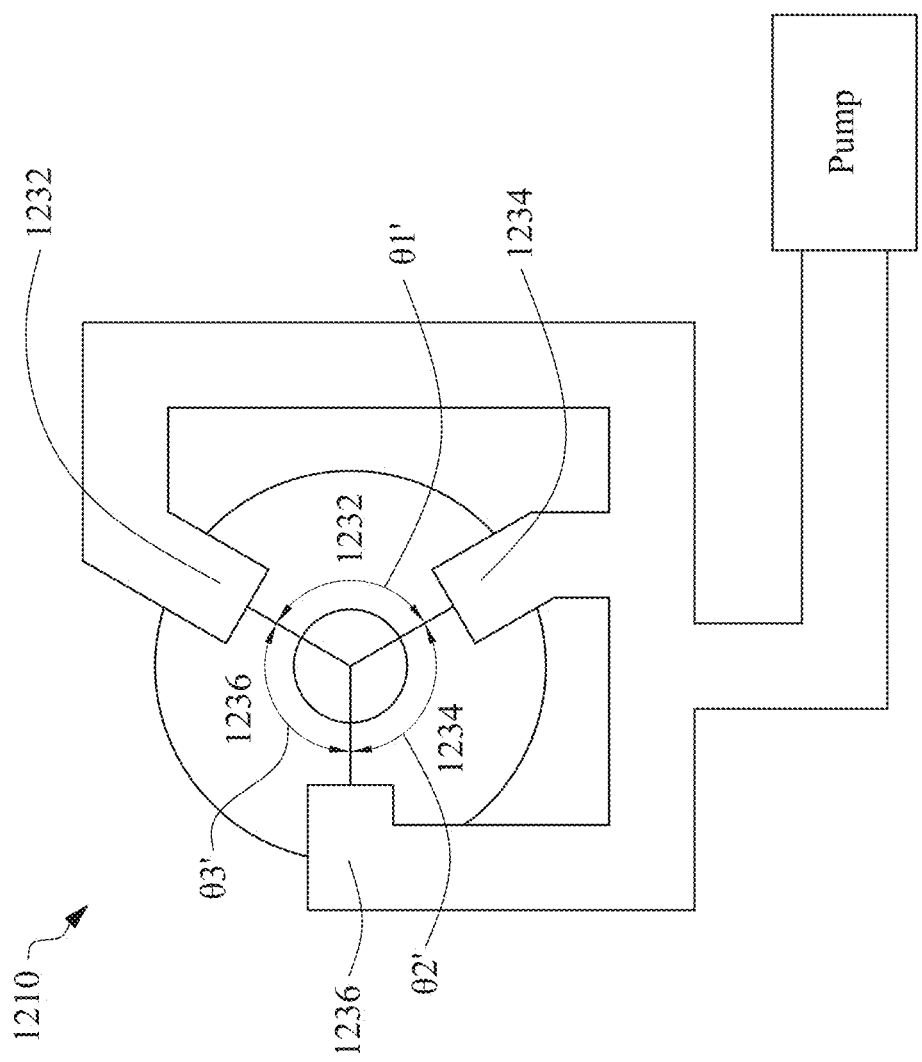
FIGS. 8A, 8B, and 8C schematically illustrate alternative exemplary layouts of the debris exhausting structure according to various embodiments.

In some embodiments shown in FIG. 8A, the debris exhausting structure 1210 includes the frustoconical surface portions 1232, 1234, 1236 of the debris collection mechanisms 150. The frustoconical surface portions 1232, 1234, 1236 have a fan shape having central angles $\theta1'$, $\theta2'$, $\theta3'$. In some embodiments, the central angles $\theta1'$, $\theta2'$, $\theta3'$ are in a range from about 115 degrees to about 125 degrees. In some embodiments, central angles $\theta1'$, $\theta2'$, $\theta3'$ are the same. The frustoconical surface portions 1232, 1234, 1236 of the EUV vessel 1000 may be equally divided into three fan areas, and at least one area subtends angle $\theta=120$ degrees. In some embodiments, angles $\theta1'$, $\theta2'$, $\theta3'$ may be different.

Figure 8B:
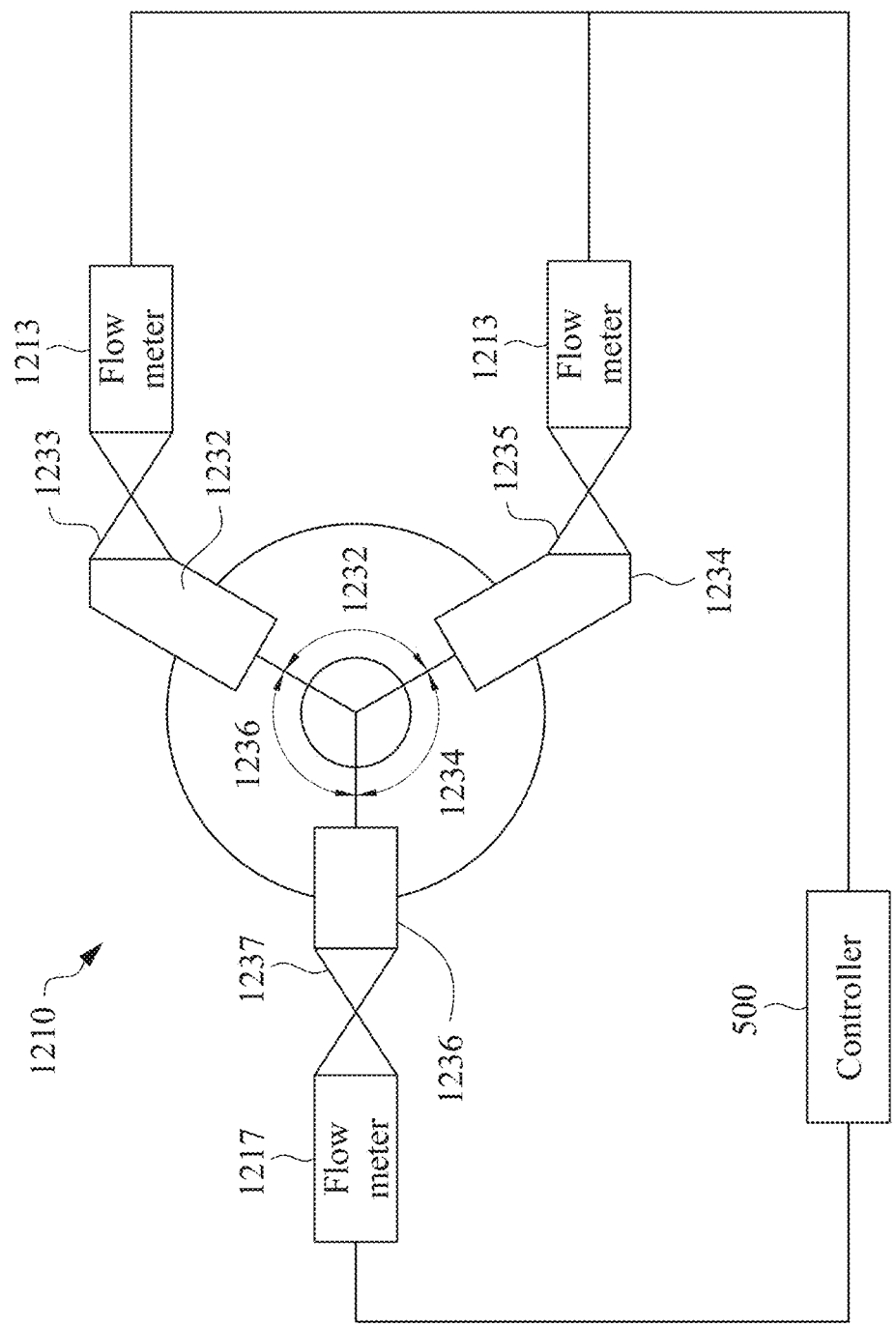

FIG. 8A schematically illustrates a top view of the triple exhaust manifold according to an embodiment. In some embodiments, three pipes 1232, 1234, 1236 having a same length and same number of bends are provided so that pumping rates from all three pipes are substantially equal. In some embodiments, the exhaust manifold includes valves (see FIG. 8C) for each of the three pipes to control the pump flow from each of the four pipes. In FIG. 8B, all three pipes are connected to a single pump. In some embodiments, the three pipes are individually connected to three separate pumps.

In some embodiments, as shown in FIG. 8B, each of the three pipes 1232, 1234, 1236 are connected to flow meters 1213, 1215, 1217 via valves 1233, 1235, 1237, respectively. In some embodiments, a controller 500 is operatively connected to the flow meters 1213, 1215, 1217, the valves 1233, 1235, 1237 and the three separate pumps, similar to that shown in FIG. 6B. The controller 500 controls operations of the valves 1233, 1235, 1237 based on measured flow rates of each of the flow meters 1213, 1215, and 1217, respectively. In some embodiments, the controller 500 includes a processor and a memory storing a control program and when the control program is executed by the processor, the control program causes the processor to perform intended operations. In some embodiments, the controller 500 includes microcomputer.

In various embodiments, the pressure in the chamber is maintained to be in a range from about 0.1 millibars to about 10 millibars. For example, the pressure in the chamber is maintained between about 1-2 millibars in some embodiments. The pressure of the pump end of each of the three pipes is about 0.1 millibars smaller than the pressure inside the chamber to maintain the flow of the gas (e.g., hydrogen) through the pipes.

Figure 8C:
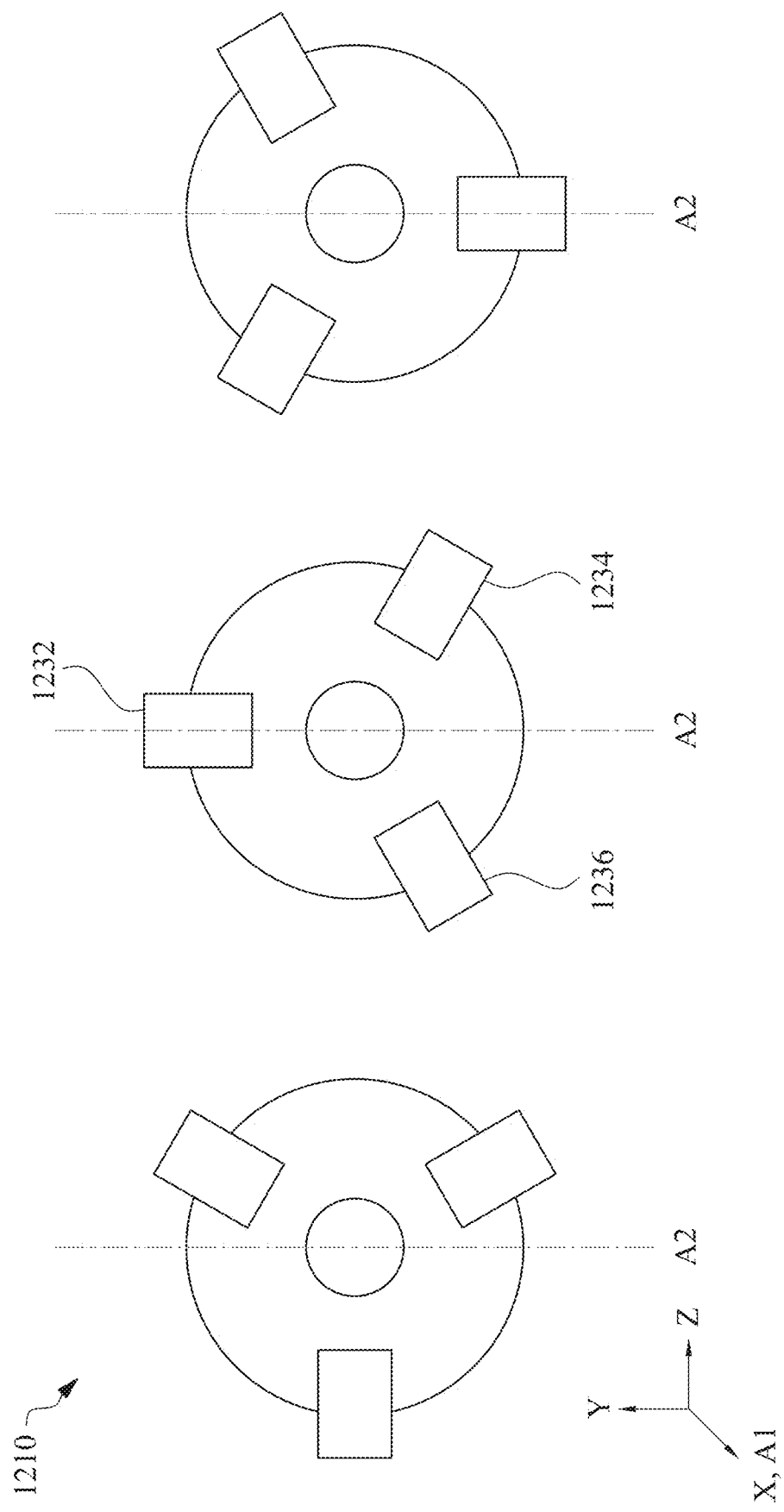

The present system may utilize any appropriate configuration of the debris exhausting structure 1210 or the three pipes 1232, 1234, 1236 relative to the droplet axis A2 including the configurations illustrated in FIG. 8C.

Figure 9B:
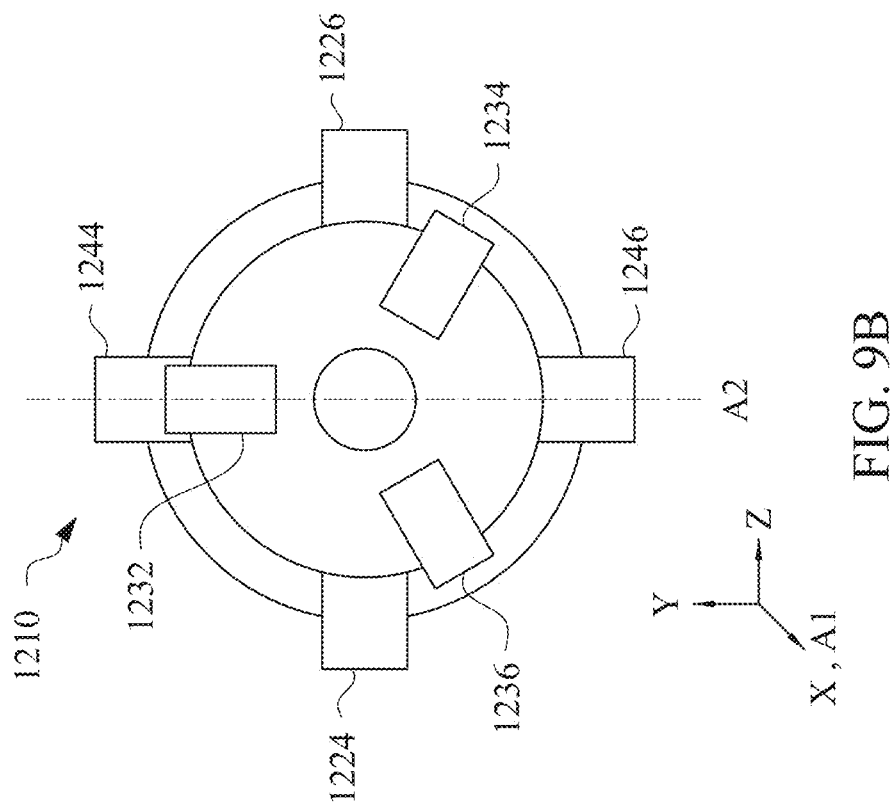
FIGS. 9A and 9B schematically illustrate alternative exemplary layouts of the debris exhausting structure according to various embodiments.
Figure 9A:
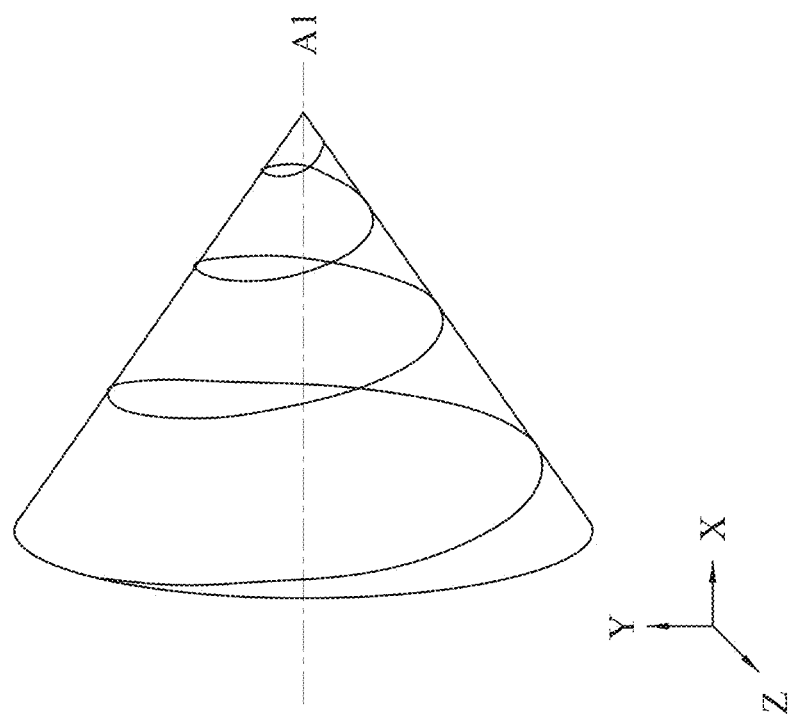

In one or more of the foregoing and following embodiments, the exhaust ports 1200 are arranged along an imaginary spiral line surrounding the EUV vessel with respect to the optical axis A1 as shown in FIG. 9A. In other embodiments, as shown in FIG. 9B, the exhaust ports 1200 can be stacked around the optical axis A1 perpendicular to the droplet axis A2. In such embodiments, four pipes 1224, 1226, 1244, 1246 forming a first layer and three pipes 1232, 1236, 1236 forming a second layer can be arranged such that the first layer and the second layer are stacked around the optical axis A1. In some embodiments, the exhaust ports 1200 may be arranged along an imaginary spiral line selected from the group consisting of a log spiral, an archimedean spiral and a sinuous spiral orientation surrounding the EUV vessel with respect to the optical axis A1 as shown in FIG. 1.

In various embodiments, three or more exhaust ports are provided in the chamber to remove cleaning gas (e.g., hydrogen) so as to provide a more uniform flow of the gas. Such uniform flow prevents regional accumulation of contamination on the collector mirror, thereby increasing the lifetime of the collector mirror and increasing the throughput of the EUV lithography system as well as reducing the cost of maintenance of the collector mirror.

In accordance with one aspect of the present disclosure, an extreme ultra violet (EUV) radiation source apparatus includes a chamber and the chamber encloses an EUV collector mirror. The EUV collector mirror is configured to collect and direct EUV radiation generated in the chamber and at least three exhaust ports are configured to remove debris from the chamber. In some embodiments, the exhaust ports are symmetrically arranged in a plane perpendicular to an optical axis of the collector mirror. In some embodiments, three exhaust ports are disposed such that an angle between any two adjacent ports is 120 degrees. In some embodiments, four exhaust ports are disposed such that an angle between any two adjacent ports is 90 degrees. In some embodiments, the chamber is configured to maintain a pressure in a range from 0.1 mbar to 10 mbar. The EUV vessel further includes a module connected to each exhaust port. In some embodiments, the EUV vessel further includes a flow meter that is connected to each exhaust port. In other embodiments, the EUV vessel further includes a controller operatively connected to valves at each exhaust port. In some embodiments, the each of the exhaust ports is connected to a separate pumping module. In some embodiments, each of the exhaust ports is connected to the pumping module through pipes having a same length and same number of bends such that pumping rates from all of the exhaust ports are substantially equal. In other embodiments, the exhaust ports are arranged in a spiral shape surrounding the EUV vessel with respect to a center axis perpendicular to the EUV collector mirror.

In accordance with another aspect of the present disclosure, a method of preventing contamination of a collector of an extreme ultraviolet (EUV) radiation source includes providing a chamber enclosing an EUV collector mirror. The EUV collector mirror is configured to collect and direct EUV radiation generated in the chamber and the chamber includes at least three exhaust outlet ports. The method also includes introducing a cleaning gas into the chamber. And subsequently, the method includes exhausting the cleaning gas to outside of the chamber through the exhaust ports.

In some embodiments, the method further includes applying a vacuum to the exhaust outlet ports using at least one pumping module. In some embodiments, each of the exhaust outlet ports are connected to a separate pumping module. In some embodiments, the each of the exhaust outlet ports are connected to the pumping module through pipes having a same length and same number of bends such that pumping rates from all of the exhaust outlet ports are substantially equal.

In accordance with another aspect of the present disclosure, an extreme ultra violet (EUV) radiation source apparatus includes a chamber and an EUV vessel disposed in the chamber. The EUV vessel includes an EUV collector mirror configured to collect and direct EUV radiation generated in the EUV vessel. A debris exhausting structure including at least three exhaust outlet ports is attached to the EUV vessel. The debris exhausting structure is configured to remove cleaning gas towards an outside of the EUV vessel. In some embodiments, the chamber is configured to maintain a pressure in a range from 0.1 mbar to 10 mbar. In some embodiments, the debris exhausting structure includes a pumping module coupled to the at least three exhaust outlet ports. In some embodiments, the EUV vessel further includes valves and flow meters that are connected to each of the at least three exhaust outlet ports. In some embodiments, the pumping module operatively connected to a controller. The controller controls the valves based on flow rates from each of the flow meters.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultra violet (EUV) radiation source apparatus, comprising:
    a chamber enclosing an EUV collector mirror;
    wherein the EUV collector mirror is configured to collect and direct EUV radiation generated in the chamber;
    at least three exhaust ports are configured to remove debris from the chamber; and
    a flow meter connected to each of the at least three exhaust ports.

2. The EUV radiation source apparatus of claim 1, wherein the at least three exhaust ports are symmetrically arranged in a plane perpendicular to an optical axis of the collector mirror.

3. The EUV radiation source apparatus of claim 1, wherein:
    three exhaust ports are provided, which are disposed such that an angle between any two adjacent ports is 120 degrees.

4. The EUV radiation source apparatus of claim 1, wherein:
    four exhaust ports are provided, which are disposed such that an angle between any two adjacent ports is 90 degrees.

5. The EUV radiation source apparatus of claim 1, wherein the chamber is configured to maintain a pressure in a range from 0.1 mbar to 10 mbar.

6. The EUV radiation source apparatus of claim 1, further comprising a pumping module connected to each of the at least three exhaust ports.

7. The EUV radiation source apparatus of claim 1, further comprising a controller operatively connected to valves at each of the at least three exhaust ports.

8. The EUV radiation source apparatus of claim 1, wherein each of the at least three exhaust ports is connected to a pumping module separately.

9. The EUV radiation source apparatus of claim 8, wherein each of the at least three exhaust ports is connected to the pumping module through pipes having a same length and same number of bends such that pumping rates from all of the at least three exhaust ports are substantially equal.

10. The EUV radiation source apparatus of claim 1, wherein the at least three exhaust ports are arranged in a spiral shape surrounding an EUV vessel with respect to a center axis perpendicular to the EUV collector mirror.

11. The EUV radiation source apparatus of claim 1, wherein the at least three exhaust ports are stacked surrounding an EUV vessel with respect to a center axis perpendicular to the EUV collector mirror.

12. A method of preventing contamination of a collector of an extreme ultraviolet (EUV) radiation source, the method comprising:
   providing a chamber enclosing an EUV collector mirror;
   collecting and directing EUV radiation generated in the chamber, by the EUV collector mirror,
      wherein the chamber includes at least three exhaust outlet ports and a flow meter connected to each of the at least three exhaust outlet ports;
   introducing a cleaning gas into the chamber; and
   exhausting the cleaning gas to outside of the chamber through the at least three exhaust outlet ports.

13. The method of claim 12, further comprising applying a vacuum to the at least three exhaust outlet ports using at least one pumping module.

14. The method of claim 13, wherein each of the at least three exhaust outlet ports are connected to a separate pumping module.

15. The method of claim 13, wherein each of the at least three exhaust outlet ports are connected to the pumping module through pipes having a same length and same number of bends such that pumping rates from all of the at least three exhaust outlet ports are substantially equal.

16. An extreme ultra violet (EUV) radiation source apparatus, comprising:
   a chamber;
   an EUV vessel disposed in the chamber, wherein the EUV vessel comprises an EUV collector mirror configured to collect and direct EUV radiation generated in the EUV vessel;
   a debris exhausting structure including at least three exhaust outlet ports attached to the EUV vessel; and
   a flow meter connected to each of the at least three exhaust outlet ports,
   wherein the debris exhausting structure is configured to remove cleaning gas towards an outside of the EUV vessel.

17. The EUV radiation source apparatus of claim 16, wherein the chamber is configured to maintain a pressure in a range from 0.1 mbar to 10 mbar.

18. The EUV radiation source apparatus of claim 16, wherein the debris exhausting structure includes a pumping module coupled to the at least three exhaust outlet ports.

19. The EUV radiation source apparatus of claim 18, further comprising valves connected to each of the at least three exhaust outlet ports.

20. The EUV radiation source apparatus of claim 19, wherein the pumping module is operatively connected to a controller, wherein the controller controls the valves based on flow rates from the flow meters connected to each of the at least three exhaust outlet ports.

* * * * *